United States Patent
Lamey, Jr. et al.

(10) Patent No.: US 6,408,219 B2
(45) Date of Patent: *Jun. 18, 2002

(54) FAB YIELD ENHANCEMENT SYSTEM

(75) Inventors: Patrick H Lamey, Jr., Los Gatos; Amotz Maimon, Cupertino, both of CA (US); Gad Yaron, Jerusalem (IL)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/075,254

(22) Filed: May 11, 1998

(51) Int. Cl.[7] .............................................. G06F 19/00
(52) U.S. Cl. ........................ 700/110; 710/121; 710/103
(58) Field of Search ............................ 700/110; 438/14, 438/16, 17, 18; 364/552, 468.7; 382/149; 702/83; 148/33; 365/552; 710/110, 121, 103

(56) References Cited

U.S. PATENT DOCUMENTS

| | | | | |
|---|---|---|---|---|
| 5,539,752 A | * | 7/1996 | Berezin et al. | 714/724 |
| 5,761,064 A | * | 6/1998 | La et al. | 364/468 |
| 5,777,901 A | | 7/1998 | Berezin et al. | |
| 5,862,055 A | * | 1/1999 | Chen et al. | 364/468.28 |
| 5,943,437 A | * | 8/1999 | Sumie et al. | 382/149 |
| 5,946,213 A | * | 8/1999 | Steffan et al. | 364/468 |
| 5,966,459 A | * | 10/1999 | Chen et al. | 382/149 |
| 5,991,699 A | * | 11/1999 | Kulkarni et al. | 702/83 |
| 5,999,003 A | * | 12/1999 | Steffan et al. | 324/537 |
| 6,009,545 A | * | 12/1999 | Tsutsui et al. | 714/718 |
| 6,016,562 A | * | 1/2000 | Miyazaki et al. | 714/724 |
| 6,092,059 A | * | 7/2000 | Straforini et al. | 706/14 |
| 6,148,099 A | * | 11/2000 | Lee et al. | 382/149 |
| 6,185,511 B1 | * | 2/2001 | Steffan et al. | 702/81 |
| 6,200,823 B1 | * | 3/2001 | Steffan et al. | 438/14 |
| 6,246,787 B1 | * | 6/2001 | Hennesey et al. | 382/141 |

FOREIGN PATENT DOCUMENTS

| | | |
|---|---|---|
| DE | 19641414 | 10/1996 |
| EP | 0783170 | 7/1997 |
| EP | 0910123 | 4/1999 |
| TW | 331650 | 6/1999 |

OTHER PUBLICATIONS

"Rapid Yield Learning Through Data Integration" Smith et al. Semiconductor International, Sep. 1996.
"New Tools for Failure Analysis"; Semiconductor International, Sep. 1996.
"Yield Management Systems" LPA Software.
"Software Solutions for Semiconductor Manufacturing" Knights Technology (multiple pages).

* cited by examiner

Primary Examiner—David Wiley
Assistant Examiner—Firmin Backer
(74) Attorney, Agent, or Firm—Sughrue, Mion, Zinn, MacPeak & Seas, LLP

(57) ABSTRACT

A yield enhancement system organizes defect classification and attribute information into a global classification scheme. The global classes are used to identify defect sources and to generate inspection and review plans. The system accumulates defect information in a database and continually refines the information to improve the accuracy of the classification assignments and the identification of the defect sources.

17 Claims, 4 Drawing Sheets

FAB YIELD ENHANCEMENT SYSTEM

FIELD OF THE INVENTION

The present invention relates to semiconductor fabrication systems and, more specifically, to a system for identifying the sources of wafer defects and using this information to control the processes in a fabrication plant.

BACKGROUND OF THE INVENTION

Semiconductor fabrication involves processing a piece of a semiconductor material (referred to as a wafer) to create electronic circuits such as transistors, resistors and inductors on the wafer. These circuits are formed by depositing material on the wafer, doping areas of the semiconductor with other elements and etching the wafer. These processes also create the connections between the circuits.

Although a wafer is relatively large (e.g., several inches in diameter), the circuits are quite small. For example, state of the art fabrication processes can produce a circuit having a feature size in the sub-micron range. As a result, the error tolerance of fabrication systems is very small. Consequently, even the slightest error in the fabrication process can cause a significant number of defects in the processed wafer.

The incentive to reduce the number of defects in the wafer production process is compounded by the cost of the fabrication plant ("FAB"). The cost of building a state-of-the-art FAB typically exceeds one billion dollars. As a result, it is imperative that the FAB yield be as high as possible to maximize the return on this investment.

The need to increase the yield in the FAB has led to the development of a variety of tools that identify defects in a wafer. Some tools enable a FAB operator to visually inspect the wafer (or a representation of the wafer) to locate defects. Typical tools of this type include optical inspection systems and scanning electron microscopes ("SEMs"). Other tools provide defect information in the form of data. Several of these tools group the defect data into classes. Given that similar defects may be caused by similar sources, this technique allows a FAB operator to more easily identify certain sources of defects.

In sum, conventional FAB tools may provide a plethora of FAB defect information. However, many of these tools do little more than generate the information and leave it to the operator to sort, classify and interpret the data. Thus, a need exists for a FAB yield enhancement system that can interpret this data and provide it to an operator in manner that enables the operator to efficiently locate the sources of the defects.

SUMMARY OF THE INVENTION

The present invention provides an automated yield enhancement system that identifies sources of defects on wafers and uses this information to control the fabrication process. The system collects defect information from the tools in the FAB and produces a global set of defect classes. Throughout the fabrication process, the system continually updates and reclassifies the global classification based on the current and prior defect data. Using the defect classification information and other FAB data, the system automatically identifies the sources of the defects and refines the analysis procedures used by the FAB inspection and review tools. In addition, the system may use the defect information and other FAB data to automatically adjust the operation of the FAB process tools to prevent similar defects from being formed on subsequently produced wafers.

In the global classification scheme, each defect is classified according to its characteristics. Preferably, these characteristics bear on the source or the severity of the defect. In contrast with conventional systems, a system constructed according to the invention provides a single, global classification scheme for defect information that may originate from a variety of tools that may otherwise be unrelated.

The system stores the classification data and other information related to the defects in a defect database. This information may include classification identifiers, defect source candidates and parameters that represent a relative confidence level that the identified candidates are indeed the source of the defect. In addition, the system may store optical review data, SEM information and wafer defect maps that are associated with the defects.

As new defects are processed, the information for the defects may be compared with corresponding information in the defect database. These classifications are continually refined and updated based on the defect information and other inputs from the FAB such as parametric data generated by tests conducted on the wafer.

To identify the source of a defect, the system processes the classification data generated by the yield enhancement system and defect source data provided by FAB tool vendors. Once the potential source of a defect is identified, the system may use this information to modify the inspection and review plans for the optical inspection and review tools, the SEM inspection and review tools or any other inspection, review or metrology tools. In addition, when the source of the defect is associated with a process tool that may be controlled by the yield enhancement system, the system may automatically adjust the process tool to eliminate the defect in subsequently fabricated wafers.

By continually updating the defect information and the review tool procedures based on accumulated data, the system may identify the sources of the defects more accurately than conventional systems. Moreover, by integrating defect information from all of the FAB tools, the system may quickly identify the source of a defect and automatically correct the problem or enable the FAB operator to do so.

BRIEF DESCRIPTION OF THE DRAWINGS

These and other features of the invention will become apparent from the following description and claims, when taken with the accompanying drawings, wherein similar references characters refer to similar elements throughout and in which:

DESCRIPTION OF EXEMPLARY EMBODIMENTS

Figure 1:
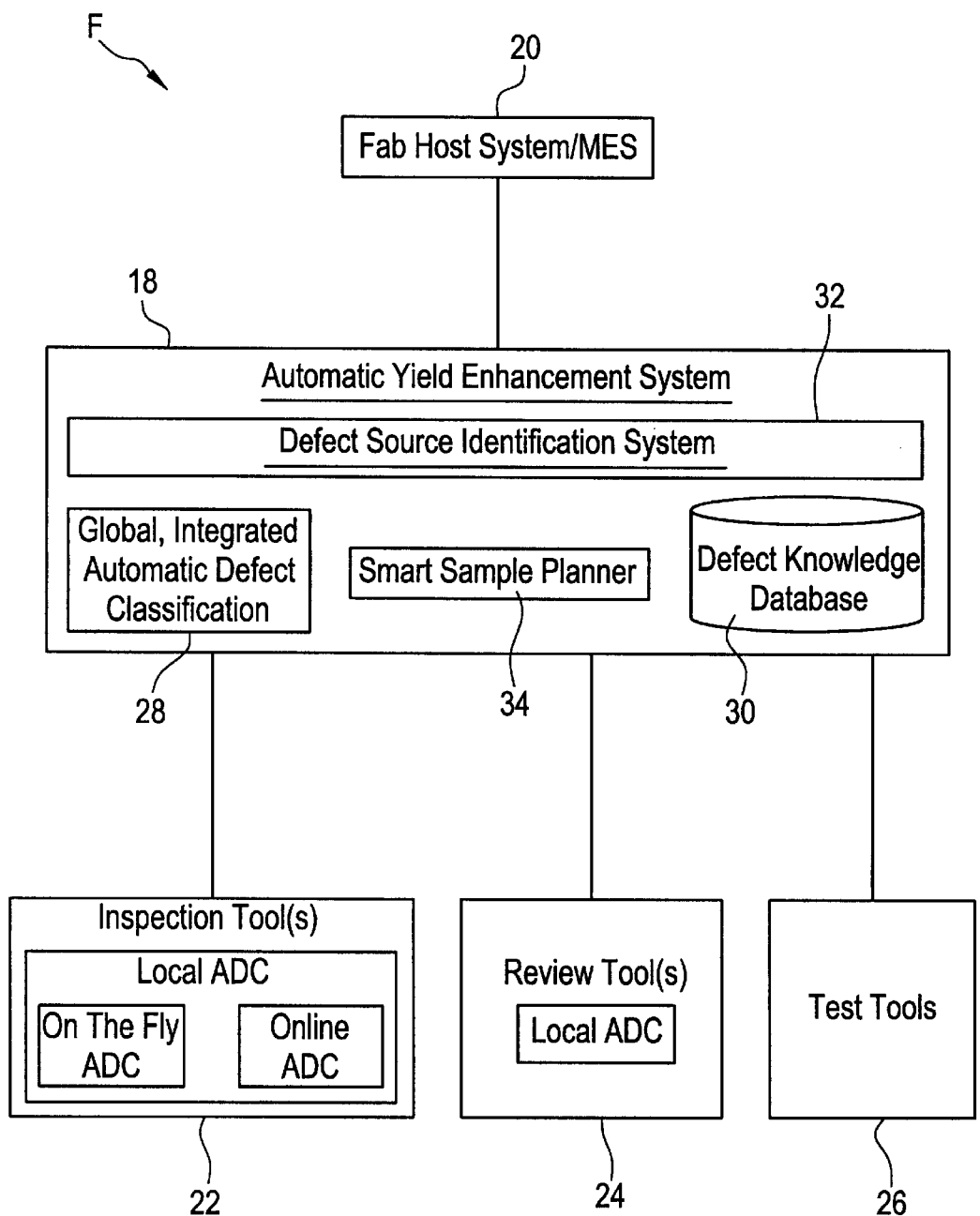
FIG. 1 is a block diagram of one embodiment of a FAB including a yield enhancement system constructed according to the invention.

In FIG. 1, a yield enhancement system 18 in a FAB F processes defect data and other information generated by a FAB host 20 and several FAB tools 22, 24 and 26. The FAB host generates work-in-progress ("WIP") data that provides information about the wafer currently being processed. The inspection tool 22 automatically generates wafer defect maps and, optionally, automatic defect classification data and other information related to defects on the wafer. The automatic defect classification data may include, for example, a classified wafer defect map, defect class data and defect attributes. The inspection tool 22 can be, for example, one or more of the "ORBOT WF 7xx" series equipment available from Applied Materials of Santa Clara, Calif. The review tool 24 may be used to review the wafer according to the defect map. If used, the review tool 24 may generate images of the defects and may provide additional automatic defect classification data and other defect information. The review tool 24 can be, for example, an "OPAL 9300" Defect Review SEM available from Applied Materials of Santa Clara, Calif. Irrespective of the defect inspection and review, the test tool 26 performs electrical tests on the wafer. These tests produce information that relates to the actual operating parameters of the wafer circuits.

The yield enhancement system 18 includes several components that cooperate to identify the sources of the wafer defects and improve the wafer inspection process. An integrated automatic defect classification ("IADC") component 28 integrates the information provided by the tools into a global classification scheme. It then refines this information in an attempt to generate the best defect classifications assignments for the current production process.

A defect knowledge database 30 accumulates defect data generated by the process tools and the yield enhancement system 18. The defects database 30 provides a reference database of known defects, their characteristics, and their sources.

An automatic defect source identification system 32 ties together all the information from the IADC and the defect database. The identification system 32 then applies intelligent decision algorithms to this information to identify the sources of the defects. In addition, the identification system 32 may provide defect warnings, suggested test procedures to validate the sources of the defects, and suggested corrective actions to fix the problems.

A smart sample planner 34 uses the classification data and the accumulated knowledge in the system to optimize the FAB review, the inspection strategy and the overall sampling strategy of the FAB.

Figure 2:
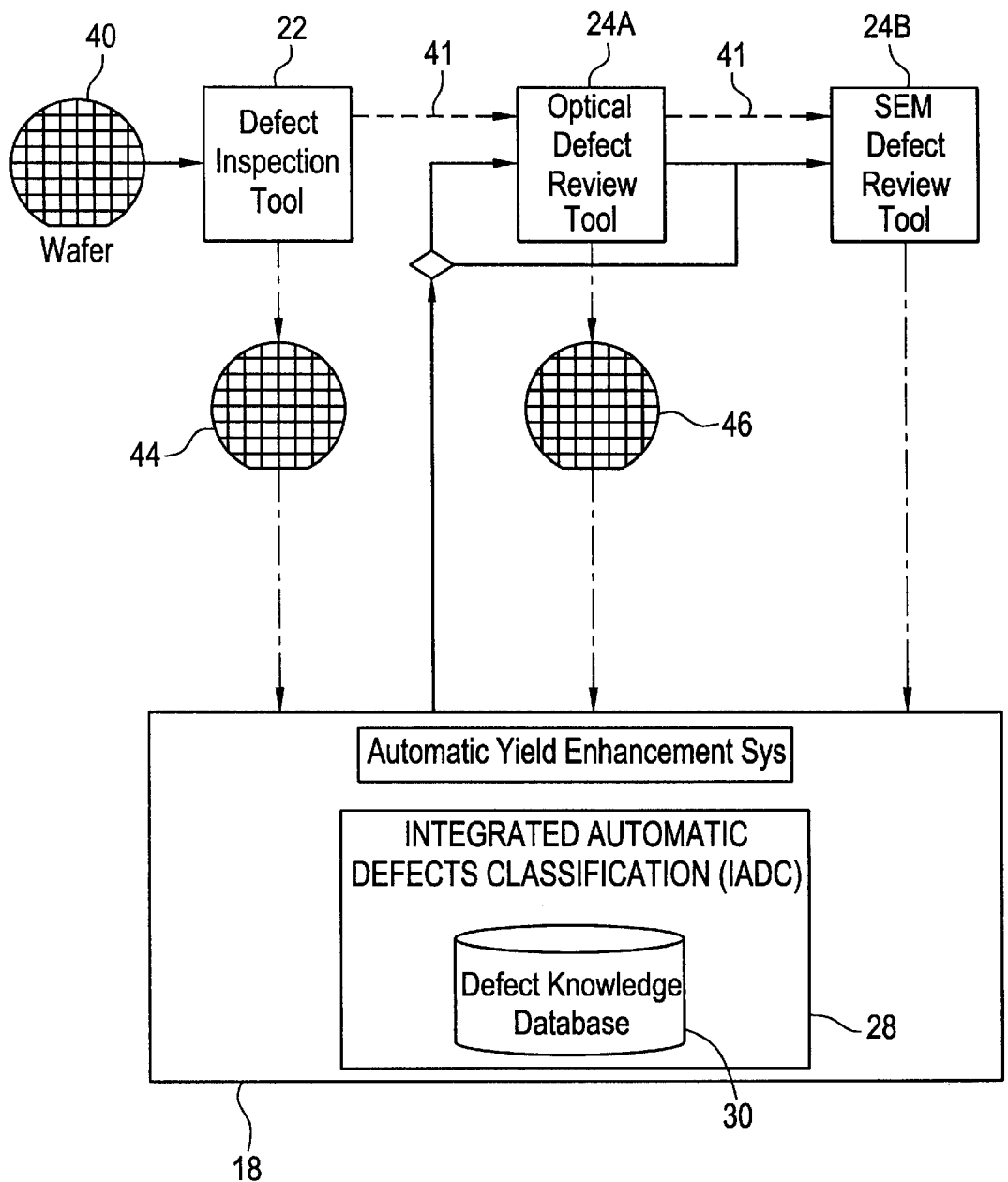
FIG. 2 is a block diagram of a FAB process flow for one embodiment of a yield enhancement system constructed according to the invention.
Figure 3:
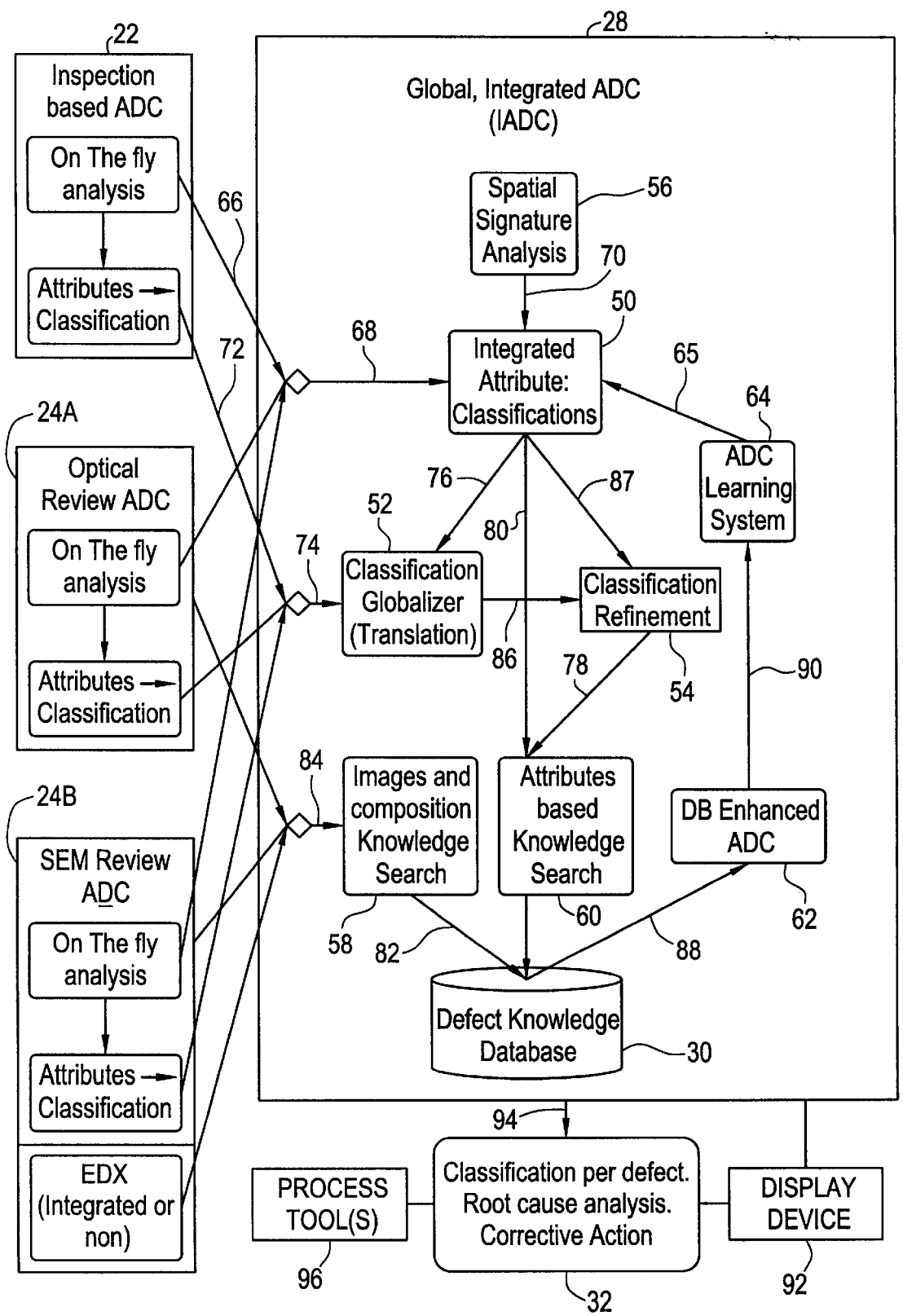
FIG. 3 is a flowchart illustrating defect processing operations in one embodiment of a yield enhancement system constructed according to the invention.
Figure 4:
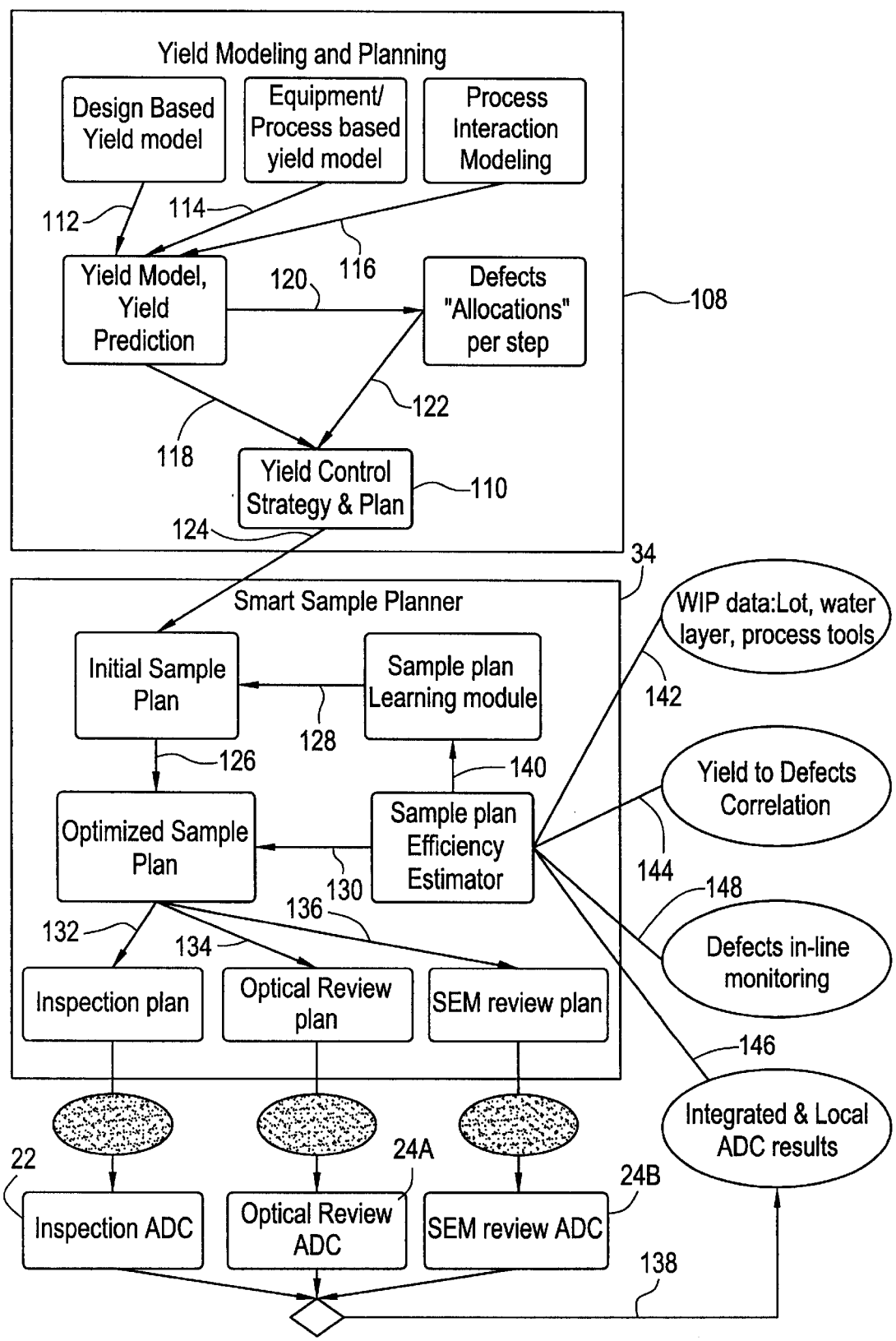
FIG. 4 is a flowchart illustrating a review plan refinement process in one embodiment of a yield enhancement system constructed according to the invention.

With the above overview in mind, the details of the system will now be discussed in more detail in conjunction with FIGS. 2–4. FIG. 2 describes a process flow in a FAB that incorporates a yield enhancement system according to the present invention. FIG. 3 describes data flow associated with an IADC. FIG. 4 describes data flow for one embodiment of yield control planning and sample planning processes operative according to the invention. To reduce the complexity of the drawings, only one inspection tool 22, review tool 24 and test tool 26 may be illustrated in some of the drawings. It should be appreciated, however, that a given FAB may include more than one inspection tool 22, review tool 24 and/or test tool 26.

Referring now to FIG. 2, a wafer 40 is sequentially fed to an automated defect inspection tool 22 and, optionally, to an optical defects review tool 24A and a SEM defects review tool 24B as represented by dashed line 41. At each stage of the inspection and review process, the tools send defect information to the yield enhancement system 18. The yield enhancement system 18 classifies the defect data, stores it in the defect database 30 and, as necessary, provides updated review procedures to the review tools 24A and 24B.

The inspection tool 22 generates inspection data including defect maps 44 and, optionally, classification attributes and classification results. The classification attributes refer to intermediate level data. That is, the results of tool sensing or image processing. Tool sensing may involve, for example, analyzing the wafer with a tool that uses a light source and a light sensor (e.g., a charge-coupled device). These results may be characterized as a collection of attributes such as size, location, shape, color, position on the layer and sensing signal characteristics (e.g., signals from the tool sensing that are proportional to the intensity of the detected light). The classification results are class identifiers. Each automatic defect classification tool (e.g., 22, 24A or 24B) may define its own set of specific identifiers and associated classes.

The inspection tool 22 sends its defect information to the IADC 28. The IADC analyzes this information and identifies clusters of defects, repeating defects and overlay defects. In addition, the IADC calculates a spatial signature analysis for the defects.

Using the defect classification data, the IADC 28 generates alarms and warnings that are based on control limits for defect levels, defect distributions and other criteria. In addition, the IADC generates a review plan for an optical review station 24A, a SEM review station 24B or any other review tools, as necessary.

If the wafer 40 contains defects that need to be studied further, the wafer 40 may be sent to the optical defects review tool 24A. The review tool 24A generates a classified defects map 46, optical images and, optionally, optical-based automatic defect classifications (not shown). Again, the defect classifications may include classification attributes and classification results.

The IADC 28 processes this information to obtain global defect classifications. To this end, the IADC may refine the data using data stored in the database 30. In addition, the IADC reclassifies the incoming defect information to conform to the global classifications that the IADC has generated for all defects in the FAB. Finally, the IADC assigns a confidence level to the defect and stores this information with the defect in the defect database 30.

In one embodiment, defects are classified in the global classification scheme based on similar spatial signature analysis results and similar on-the-fly automatic defect classification results. In addition, the images may be associated with the defect data per the defect classification scheme. In any event, the defects are presented to the FAB operator as a single, uniform set of defect classes.

As above, based on the defect classifications, the IADC generates alarms and warnings. In addition, if needed, the IADC generates a SEM review plan.

If SEM review is desired, the wafer 40 is sent to the SEM defects review tool 24B. The review tool 24B generates a re-classified defect map (not shown), SEM defect images and, optionally, SEM-based automatic defect classifications and, if needed, composition data such as EDX.

The IADC 28 processes the SEM information to further refine and globalize the defect information and assign new confidence levels to the results. Finally, the IADC generates alarms and warnings, as necessary, and stores the classified defect map in the database 30.

FIG. 3 describes the basic operations of the IADC 28. Briefly, the IADC 28 receives defect data from the inspection and review tools 22, 24A and 24B. At blocks 50, 52 and 54, the IADC 28 classifies the defects based on the defect data and data from spatial signature analysis 56 of the wafer defects. The IADC stores all of the data related to the defects in the database 30. Thus, the defect data is readily available for future classification searches 58 and 60. In addition, as represented by blocks 62 and 64, the IADC 28 has "learning" capabilities in that it continually refines the defect classifications and defect source data based on received defect data. As discussed above, the defect source identification system 32 uses the defect data to identify the source of the defects and initiate corrective action.

Turning now to the details of FIG. 3, the IADC 28 aligns and consolidates the defect data from all the local automatic defect classification ("ADC") tools to produce unified classification.

Each of ADC tools depicted in FIG. 3 analyzes detected defects and generates defect attribute data. For example, referring initially to the inspection based ADC tool 22, the tool 22 inspects the wafer and classifies detected defects. When available (for example when using the "ORBOT WF 7xx" series equipment), the tool 22 performs on-the-fly automatic defect classification. Tool 22 then sends the local automatic defect classification attribute data (e.g., intensity of scattered light, etc.) to the IADC 28 as represented by line 66. As represented by block 50, the IADC processes the attribute data from the tools (line 68) along with spatial signature analysis information (line 70) and data from an ADC learning system 64 (via line 65) to generate integrated attribute classifications. The spatial signature analysis information 70 consists of a conventional set of algorithms that describe a zonal analysis of defects distributed across the wafer. The ADC learning system 64 is described in more detail below.

Each of the ADC tools depicted in FIG. 3 also processes the attribute data to classify the defects into local, tool-specific classes as mentioned above. Referring again to the inspection based ADC tool 22, the tool 22 provides local automatic defect classification results (e.g., a classified defect map) to the IADC 28 as represented by line 72. The IADC 28 uses the class data from the tools (line 74) and the integrated attributes (line 76) to generate globalized classifications 52. At this stage, the various class identifiers from the FAB are translated into a uniform, global set of classes.

The IADC 28 stores all of the classification parameters related to the defects in the database 30. Specifically, the IADC stores the refined classification data (line 78) and the integrated attributes classification information (line 80) in the defect knowledge database 30. This includes automatic defect classification attribute data (block 60) that may be accessed during knowledge-based searches of the database 30.

The IADC 28 also stores defect image and composition data (line 82) in the database 30. This information originates from the optical tool 24A and the SEM tool 24B in the form of raw images and material identification data (line 84). Typically, the IADC uses this information during knowledge-based searches 58 of the defect database 30 as discussed below.

During the classification process, the IADC 28 refines and corrects the global classifications (line 86) and the integrated attributes classification (line 87) to provide enhanced classification results (block 54). By combining the data from the different local classifications, the IADC can provide a more accurate classification than the local classifications.

The classification refinement operation may take several forms. For example, the IADC 28 may combine the results of specific defect classifications (e.g., inspection based ADC 22 or optical review ADC 24A) and spatial defects distribution classification (e.g., spatial signature analysis 56) to refine the classification and increase it's accuracy.

One example for providing the global classification is by using weighting and probability factors. That is, each tool sends classification and level of confidence data to the IADC 28. If a conflict arises, the IADC 28 can apply the level of confidence to the classification of each tool to arrive at a final determination. Thus, for tools 1 and 2, classifications $X_1$ and $X_2$, and levels of confidence $P_1$ and $P_2$, the IADC 28 can perform $P_1(X_1)+P_2(X_2) \rightarrow X_G$, where the classification of $X_G$ can be determined from a look-up table or using a threshold.

Using weights assigned to each tool, e.g., $W_1$ and $W_2$, the IADC 28 can give preferential treatment to certain tools (e.g., a higher weight may be given to a high sensitivity review tool than to a fast scan inspection tool). Thus, the IADC 28 will perform $W_1 \cdot P_1(X_1)+W_2 \cdot P_2(X_2)=X_G$. The weights can be specific to a tool and can be individualized per class of defects. As the system learns the sensitivity of the tools to the specific processing lines (using prior correct/incorrect classifications), the weights can be adjusted accordingly. It should be appreciated that for a certain tool/class, the weight can be set to zero to ignore the classification provided by that tool. In a similar fashion, FAB frequency can be taken into account.

The IADC 28 may be integrated into the classification chain depicted in FIG. 2. In this case, the classification is refined after each stage in the chain. That is, the classification is refined after the inspection based ADC 22. It is refined again after the optical review ADC 24A and once again after the SEM ADC 24B.

Furthermore, the IADC 28 may integrate the above chain into a learning system that combines all past defect results and spatial signature analyses. The results of a knowledge-based classification (one or more class identifiers and related data) are processed (line 88) by the enhanced ADC component 62. From this, the component 62 generates a classification history which may include the original input data (classification attributes), the original classification data, the intermediate refinement data and the final classification data.

The classification history data is used (line 90) by the ADC learning system 64 to assign and refine confidence levels and weights for future ADC results and to optimize the integrated ADC operation for faster and more accurate classifications. Thus, the learning system 64 uses information from prior defects to continually refine the classifications and the assignment of defects to those classifications.

The classification process may be better understood by way of the following example. Initially, the IADC 28 receives defect information from one of the ADC tools. The defect may be, for example, a foreign particle on the surface of the wafer where the particle has a particular size and shape. In this example, the received defect information may initially only include the local class number (e.g., the number 25) that the ADC tool assigns to this type of defect. Preferably, the defect information also includes a confidence level determined by the inspection tool.

The next step in the process may depend on the reported confidence level or the confidence level that the IADC assigned to the local defect classification. For example, when there is a high level of confidence that the ADC tool accurately identifies this class of defect, the IADC may simply translate the local class into a global class. A high level of confidence for a given local class may be indicated by a high confidence value relative to the confidence level of other classes assigned to this defect by other ADC processes (e.g., 90% vs. 10%).

When a translation of this particular local class to a global class has been predefined, the translation process may simply involve changing the class number. When the translation has not been predefined, however, the IADC must fit the class into an existing global class or generate a new global class for this type of defect.

If the confidence level is not particularly high, the IADC 28 may perform additional steps to calculate an appropriate global class. This may be the case, for example, when two ADC tools assign different classes to the defect and each class has approximately the same confidence level.

In this case, the IADC 28 may request the defect attributes (e.g., sensing attributes such as intensity level or defect attributes such as whether it is a particle; its size: e.g., less than 0.1 microns; and its shape: e.g., approximately round) from the ADC tools and assign a class based the corresponding defect attributes 50 and/or on spatial signature analysis information 56 associated with the defect. This may involve, for example, comparing the defect attributes with the attributes associated with the global classes.

In addition, the IADC 28, will assign an initial confidence level to this class. In accordance with the invention, the IADC may assign a confidence level by combining algorithmic approaches with past empirical data. For example, the confidence level may be based on the relative number (e.g., percentage) of matches (e.g., size, shape, density) between the class attributes and the attributes associated with the defect. The class and/or the confidence level may then be refined by subsequent ADC processes.

The case where two ADC tools (e.g., 22 or 24) provide conflicting classification data illustrates a situation where the ADC learning system 64 may be used to control the ADC tools to improve the inspection and review process in the FAB. Some ADC tools have variable defect thresholds or decision criteria. For example, an ADC tool may be configured so that only signals above a certain intensity would be reported as defects. In this case, after the proper classification has been determined, the ADC learning system 64 may send messages to the appropriate ADC tools to change their threshold settings to result in a proper classification in future inspections. Alternatively, the learning system 64 may send a message to a display device 92 that informs the FAB operator that the thresholds of the ADC tools should be changed.

If the confidence level is still unacceptably low after the step previously discussed, the IADC 28 may attempt to classify the defect by performing a database search. In this case, the IADC will compare the attributes, the signature analysis, the defect maps, the image data and other information associated with the defect with the knowledge search information (e.g., 58 and 60) stored in the database 30. As above, the selected global class and confidence levels may be based on the relative percentage of matches between the information associated with the defect and the information stored in the database 30.

Using the defect classification data and other FAB data such as overlay, yield and kill ratio information, the IADC 28 attempts to generate (line 94) the best classification possible for a given production line. This classification may include a class identifier for each defect and potential alternative classes in case of inconclusive class identification. In addition, the IADC typically produces a confidence level for each of the classifications.

It should be appreciated that the use of the database 30 as described herein provides an advantageous method of coordinating the various processes of the yield management system 18. The database 30 stores information that is used in the defect classification process, in the defect classification refinement process and in the defect source identification process.

Briefly, the database 30 stores all of the defect data including the defect attributes, spatial signatures, the local and global classes, confidence levels, defect densities, descriptive texts of the events, wafer maps and images. Database 30 may also store manufacturer-specific data. For example, a manufacturer of an etch chamber may provide specific data related to defects caused by corrosion in the chamber. Such data can help in pointing out the specific chamber causing a specific defect.

By storing all classification data in the database 30, a yield engineer can access this data to determine how a specific classification was assigned. Moreover, the yield engineer may perform manual classifications whereby the engineer manually "teaches" the system to tie specific parameters to a specific class, thereby customizing and improving the classification results for a particular FAB and application. This procedure or a similar procedure may be used at a later date by the system or by the FAB engineer to assign a class to other defects. For example, the yield enhancement system may be programmed to follow similar procedures to perform automatic defect classification.

The IADC 28 also uses the information in the defects database 30 to validate the algorithmic classifications on an ongoing basis. Thus, over time, the accuracy of the algorithmic classifications will increase and the chance of erroneous or fruitless classifications will decrease. Moreover, it should be appreciated that the database 30 may initially be configured without any defect information. In this case, the yield enhancement system 18 can add defect information to the database as it acquires defect information from the FAB and/or the operator may input information that correlates the defects with potential sources, or with manufacturer-specific data as it is received at the FAB.

Given FAB yield data as an input, the IADC 28 can correlate yield results to specific defects and defect classes. As a result, the IADC may refine the identification of killer defects. This may, in turn, enable the yield engineer to ignore a significant percentage of nuisance and redundant defects, while concentrating on avoiding killer defects.

Referring now to the defect source identification system 32, the identification system 32 uses the information from the IADC (line 94) and the database 30 to identify potential sources for a given defect or a class. In particular, the identification system 32 may use the defect source information stored in the database 30. This information typically would be in the form: machine "x" may have problem "y" and this will show up as a defect of class "z." Such information may be displayed on display device 92.

The defect source identification system 32 may also perform more complicated defect root causes analysis. For example, the identification system 32 may identify a defect source using the specific defect and defect class identified by the inspection and review tools 22 and 24 and the local and global classification data and associated source information from the IADC 28 and the database 30. For example, a class that covers missing or extra signal path patterns may relate to a problem in the photo-resist process. Thus, the source of this problem may be the introduction of a foreign particle prior to the etch process. Alteratively, an embedded particle may indicate a problem before the deposition process. These problems may, in turn, be traced to specific equipment in the FAB, especially when manufacturer-specific data is available.

Other inputs to the identification system 32 may include work-in-progress ("WIP") data and yield data from the FAB host system 20 and the accumulated statistical probability data calculated by the yield enhancement system.

The defect source identification system 32 also generates automatic alarms and warnings associated with the class identifier(s) as configured by the FAB. In particular, the yield enhancement system 18 can provide class density monitoring rather than conventional total density monitoring. Because prior high defect events may be stored on a per class basis, the yield enhancement system 18 can generate alarms based on a threshold for specific classes. This is in contrast to many conventional systems that generate alarms based on a threshold for the aggregate of the defects. As a result, using a yield enhancement system constructed according to the invention, the yield engineer can rapidly identify developing excursions in a given class that would otherwise be insignificant (and hence relatively difficult to identify) in relation to the aggregate of the defects.

The defect source identification system 32 may generate suggested test procedures to verify the identification of the source of the defect. For example, the identification system 32 may identify a given sub-process of a process tool (e.g., an incorrect temperature at a given etcher stage) as a possible source of a defect. If that process tool (e.g., the etcher) has a built-in self-test for that sub-process, the identification system 32 may automatically send a message to the process tool (using the WIP data that identifies the etcher number) requesting the process tool to run a self-test. In addition, the identification system 32 also requests the process tool to send back the results of the test to the identification system. This may be done, for example, by sending an appropriate message to the process tool or tools 96. If that sub-process fails (e.g., the temperature is incorrect), the identification system 32 may increase the level of confidence that that sub-process is the cause of the defect, as appropriate.

The defect source identification system 32 may initiate corrective procedures to fix the problem. In the previous example, the etcher may have an interface that allows a remote device to adjust the temperature by sending an appropriate command. In this case, the identification system 32 may be configured to send this command in the event the self-test failed. Alternatively, the identification system may be configured to display a message on the display device 92 that informs the FAB engineer to check parameter "x" (e.g., temperature) on machine "y" (e.g., etcher number 4).

FIG. 4 describes yield control planning and sample planning operations in accordance with one embodiment of the invention. A yield modeling and planning component 108 generates a yield control and strategy plan 110. Typically, an initial plan is developed when the FAB is set up based on simulation modeling of the performance and interaction of the equipment installed in the FAB. In accordance with the invention, a smart sample planner 34 continually refines the yield control plan (e.g., the wafer inspection and review plans) based on in-line information such as WIP data from the FAB equipment, actual wafer yield data and ADC data as discussed above.

In the yield control planning component 108, design-based yield modeling incorporates mathematical modeling and simulation algorithms to generate (line 112) predictions of yield sensitivities for each layer and for particular areas on the chip. Predictions may also be generated for potential killer defects sizes, distributions, and quantities. Process tool-based yield modeling uses historical data and statistical analysis and prediction to generate (line 114) predictions of defects for a set of process tools.

From this information and the results from process interaction modeling (line 116), the modeling and planning component 108 generates yield predictions for the entire line and the specific production modules (lines 118 and 120). In addition, the component 108 generates yield thresholds for each process module and for each process tool in the FAB (line 122). Finally, the yield control component 110 generates the yield control plan (line 124) for the entire production line. This plan may define which tools are used in the FAB. It may define how to position the tools and how to use them. In addition, the plan may specify which wafers are to be inspected.

The sample planner 34 uses the in-line defect classification data discussed above and other accumulated knowledge in the system to improve the effectiveness of the yield control plan. By continually refining the yield control plan, the sample planner 34 will enable the yield engineer to more effectively focus on killer defects and defects of interest. As a result, this may reduce the amount of time the yield engineer spends reviewing defects on each wafer and reduce the number of test wafer that must be wasted when setting up a wafer process in the FAB.

The sample planner 34 generates a preliminary inspection and review plan (line 126) using the yield control plan and an enhanced set of initial planning rules (line 128). The initial sample plan is optimized using efficiency estimations (line 130) to produce the wafer inspection plan (line 132, e.g., which wafer to inspect, when to inspect it and how to inspect it), an optical review plan (line 134) and a SEM review plan (line 136).

Using the above information, the sample planner generates inspection recipes that are tuned and optimized for the specific layer inspected. The sample planner provides optimized ADC, by an inspection tool (re-visited) and/or by a review tool. The sample planner also may provide an optimized sampling plan for the review tool.

The sample planner may be programmed to "learn" which type of defects warrant further review and which type of defects may be skipped during the review process. For example, if a hundred particles are located at a specific location on the wafer, it may only be necessary to review a few (e.g., five) of these particles with the review tool. This may be the case where there is a relatively high level of confidence in the defect information provided by an inspection tool that indicates that all one hundred of the defects are similar particles. This high level of confidence may result from, for example, prior occurrences of similar defects. Thus, once the system is tuned and there is confidence in the inspection tool, this information may be programmed into the sampling plan so that the review tool automatically reviews just five of the one hundred defects.

As discussed above in conjunction with FIGS. 1–3, the inspection and review information is then fed back into the yield enhancement system 18 (line 138). The fed back information is used for efficiency evaluations and to generate proposed enhancements to the inspection and review plans and for an efficiency evaluation of the original inspection plan (line 140). These enhancements are based on the inspections and review direct results (defects of interest) and on the historical correlation of the defects to actual yield (test data).

The inputs to the efficiency estimator include layer and process tools data acquired from the FAB host (line 142). This may include, for example, metrology and process tool data such as the state of a process tool. The inputs may also include killer defect identification information that is based on past correlation with actual yield data (line 144). In addition, defects classification information (line 148) and information about the defects distribution on the wafers that is obtained from spatial signature analysis (line 148) may also be fed into the yield enhancement system 18.

From the above, it may be seen that the sample planner uses the layer and tool information to decrease inspection and review time and improve inspection results. This results in reduced test wafer consumption in the FAB and reduces throughput time for production material, reduces capital expenditures for inspection/review/metrology tools and saves FAB floor space.

The automatic yield enhancement system shortens the time to identify the sources of yield excursions, shortens the learning time of new defects, and improves the productivity of the wafer inspection and review tools by optimizing their use. These goals are achieved through improved data management; integrating several types of FAB data and utilizing new software algorithms to automate and speed up the decision process to monitor and control FAB yield. The system is a learning system, accumulating data in both automatic and manual modes, and improving the accuracy of automatic decisions based on that accumulated data. The productivity of the inspections and review tools also improved by the sampling planning module. This module uses the integrated data to provide improved plans for using the tools.

The system may be deployed across the FAB, as an overall yield enhancement system. Alternatively, it may be deployed in specific areas of the FAB to provide yield control for a specific group of process, inspection, and metrology tools. For example, in a fully automated system (manufacturing cells, short loop control), the validation and corrective action may be communicated automatically to the process tool, thereby prompting it to perform automatic service routines. In this embodiment, the system uses the service routines supplied by the process tool manufacturer and complies with the protocol that activates them automatically.

It should be appreciated that the defect knowledge database can be used for defect source identification irrespective, or in addition to, defect classification. Thus, for example, inspection tool 22 (FIG. 1) can send a defect map to the automatic yield enhancement system 18. Then, certain or all of the defects (depending, for example, of the output of the smart sampling plan 34) may be reviewed in the optical and/or SEM review tools (24A, 24B, FIG. 2). Further, if particles are found, a material (EDX) analysis can be performed using, for example, a SEM review station such as the Opal 9300 in an EDX mode.

Since the defect knowledge database includes defect information, such as manufacturer specific and previous analyses results, a search for a match can be performed using the optical and/or SEM images and the EDX results. In many cases, a good match can obviate further processing and point directly at the defect source and proposed corrective action. For example, particles can come from different sources and different parts of the processing chambers. When particles of particular composition are identified, they are stored in the defect knowledge database. When the source of the particles has been eliminated using a particular corrective action, the corrective action is also stored with a link to the particle information. Then, using a material composition match, the appropriate chamber can be identified and the stored corrective action provided as a probable solution for the problem.

Thus, for example, when it is discovered that particles of particular composition have been introduced from a dome of an etcher, and that a plasma clear has solved the problem, such data can be stored in the defect knowledge database. Then, during an investigation of particles problem, when the EDX reveals that the particles are of the same composition as stored in the database, the system may suggest that a plasma clean be performed on the etcher dome. Thus, the suggested corrective action can be reached at very fast, while avoiding having to perform much processing. Of course, at the same time the system may perform the classification and other processing as discussed above.

From the above, it may be seen that a system constructed according to the invention provides improved semiconductor fabrication. While certain specific embodiments of the invention are disclosed as typical, the invention is not limited to these particular forms, but rather is applicable broadly to all such variations as fall within the scope of the appended claims. To those skilled in the art to which the invention pertains many modifications and adaptations will occur. For example, various method classification schemes and methods may be used in implementing the teachings of the invention. In addition, a variety of methods may be sued to identify the source of defects. Moreover, the learning aspects of the invention may be implemented in many ways. Thus, the specific structures and methods discussed in detail above are merely illustrative of a few specific embodiments of the invention.

What is claimed is:

1. A defect classification method, for use in a semiconductor fabrication plant, said method comprising:
   inspecting a wafer using a plurality of wafer analysis tools;
   providing local classification based on defect data from each of the plurality of wafer analysis tools;
   integrating said local classifications; and
   assigning a global classification for the defect based on the integration.

2. The method of claim 1 wherein the assigning step further comprises the step of comparing at least one attribute of the global classification with yield data from the fabrication plant.

3. The method of claim 1 wherein the assigning step further comprises the step of comparing the defect attribute data with attribute data stored in database.

4. The method of claim 1 further comprising the step of confidence level assignment, wherein a confidence level is assigned to the global classification based on empirical defect data.

5. The method of claim 1 wherein the assigning step further comprises the step of comparing an attribute of the global classification with spatial signature analysis data associated with the defect.

6. The method of claim 1 further comprising the step of identifying, based on the global classification, at least one suggested source of the defect.

7. The method of claim 1 further comprising:
   generating update data for at least one of a wafer inspection plan and a wafer review plan wherein said update data is used to validate algorithms in an ongoing basis and refine the wafer inspection and wafer review plan.

8. The method of claim 1 further comprising the step of generating corrective action data for a wafer process tool.

9. The method of claim 1 further comprising the step of initiating a verification operation for a wafer process tool.

10. An automatic yield enhancement system for a semiconductor plant comprising:
    a plurality of wafer analysis tools, including inspection tools and review tools, adapted to provide local classification data for a defect, wherein each of said tools provide a separated local classification data;

a global automatic defect classification module adapted to receive the local classification data and provide a global classification data;

a defect reference database adapted to store characteristics of wafer defects; and a defect source identification module adapted to receive the global defect classification and defect data and further adapted to determine defect identification and defect source data.

11. The automatic yield enhancement system of claim 10, further comprising a learning module receiving the global defect classification data and based thereupon adjusting operation parameters of the global automatic defect classification module.

12. The automatic yield enhancement system of claim 10, further comprising a learning module receiving the global defect classification data and sending update information to at least one of the inspection and review tools.

13. The automatic yield enhancement system of claim 10, further comprising a corrective action module receiving data from at least one of the global automatic defect classification module, the defect reference data base, and the defect source identification module, and providing a check list of proposed investigate and corrective actions to be taken for reducing identified defects.

14. The automatic yield enhancement system of claim 10, further comprising an equipment operation parameters module receiving the defect source data and based thereupon sending a self diagnostic instruction to the fabrication plant's processing equipment.

15. The automatic yield enhancement system of claim 10, further comprising a sampling module receiving data from the inspection tool and the defect reference database and, based thereupon, generating a defect review sampling plan.

16. The automatic yield enhancement system of claim 10 further receiving defect attributes and classification data from inspection and review tools, and performing the following operations:

for each defect examining whether the classification of the inspection and review tools are the same and, if so, issuing the classification as the global classification;

when the classification of the inspection and review tools is different, examining the defect attributes data to determine global classification for the defect;

when the attributes and classification data do not lead to a predefined certainty in defect classification, searching a defect database to determine a global classification for the defect;

when necessary, based on the global classification, sending a signal to one of the inspection and review tool to adjust classification parameters.

17. A method of identifying a source of a wafer defect in a semiconductor fabrication plant, the method comprising the steps of:

receiving defect classification data from a plurality of wafer analysis tools;

generating a local defect classification from said defect classification data;

generating global defect classification based on integrating said local defect classification;

storing characteristics of various wafer defects in a database; and determining defect identification and defect source data from the global defect classification.

* * * * *